United States Patent
Makino

(10) Patent No.: US 6,653,693 B1
(45) Date of Patent: *Nov. 25, 2003

(54) SEMICONDUCTOR INTEGRATED CIRCUIT DEVICE

(75) Inventor: Hiroshi Makino, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/034,257

(22) Filed: Mar. 4, 1998

(30) Foreign Application Priority Data

Nov. 11, 1997  (JP) ............................. 9-309024

(51) Int. Cl.$^7$ .......................................... H01L 21/8232
(52) U.S. Cl. ....................... 257/391; 257/392; 257/393; 257/401
(58) Field of Search ................................ 257/372, 379, 257/390, 391, 401, 909, 206, 392, 393

(56) References Cited

U.S. PATENT DOCUMENTS

| | | | | |
|---|---|---|---|---|
| 4,855,620 A | * | 8/1989 | Duvvury et al. | ............ 326/119 |
| 5,073,726 A | * | 12/1991 | Kato et al. | ..................... 326/24 |
| 5,309,011 A | * | 5/1994 | Tazunoki et al. | |
| 5,455,438 A | * | 10/1995 | Hashimoto et al. | |
| 5,633,600 A | * | 5/1997 | Ohnishi | ....................... 326/17 |
| 5,652,457 A | * | 7/1997 | Ikeda et al. | |
| 6,144,223 A | * | 11/2000 | Momtaz | ..................... 326/83 |
| 6,181,542 B1 | * | 1/2001 | Liang et al. | ................ 361/111 |

FOREIGN PATENT DOCUMENTS

| | | | | |
|---|---|---|---|---|
| JP | 54069949 A | * | 6/1979 | ......... H03K/17/60 |
| JP | 59169225 A | * | 9/1984 | ........ H03K/17/687 |
| JP | 62283718 A | * | 12/1987 | ........ H03K/19/094 |
| JP | 02203620 A | * | 8/1990 | ...... H03K/19/0948 |
| JP | 04056342 A | * | 2/1992 | ........... H01L/21/82 |
| JP | 04170063 A | * | 6/1992 | ........... H01L/27/04 |
| JP | 04254777 A | * | 9/1992 | ........... G01R/31/28 |
| JP | A-6/29834 | | 2/1994 | |
| JP | A-212218 | | 8/1995 | |
| JP | A-8/18021 | | 1/1996 | |

* cited by examiner

Primary Examiner—George Fourson
(74) Attorney, Agent, or Firm—Burns, Doane, Swecker & Mathis, LLP

(57) ABSTRACT

A semiconductor integrated circuit device of a low power consumption capable of performing under a low voltage has an array section 21 in which only low threshold voltage MOS FETs are formed, and areas other than the array section 21 in which high threshold voltage MOS FETs whose threshold voltage is higher than that of each low threshold voltage MOS FET formed in the array section are formed.

5 Claims, 8 Drawing Sheets

US 6,653,693 B1

SEMICONDUCTOR INTEGRATED CIRCUIT DEVICE

BACKGROUND OF THE INVENTION

1. Field of the Invention

The present invention relates to a semiconductor integrated circuit device of a low electric power consumption type.

2. Description of the Prior Art

FIG. 1 is a circuit diagram showing the configuration of a circuit capable of performing under a low electric voltage as a semiconductor integrated circuit device that will be used for explanation of preferred embodiments according to the present invention and following conventional examples. The diagram of this circuit capable of performing under the low voltage shown in FIG. 1 was also disclosed in the patent document of Japanese patent laid open publication number JP-A-7/212218 as a conventional semiconductor integrated circuit device.

The circuit capable of performing under a low electrical voltage as a semiconductor integrated circuit device shown in FIG. 1 comprises multi-threshold complementary metal oxide semiconductors (hereinafter also referred to as MT CMOS).

In FIG. 1, the reference number 1 designates a two-input NAND gate. Each of the reference numbers 2 and 3 denotes a p channel type metal oxide semiconductor field effect transistor (hereinafter referred to as a p MOS FET). Each of the reference numbers 4 and 5 indicates n channel type metal oxide semiconductor field effect transistors (hereinafter referred to as a n channel MOS FET). In the circuit shown in FIG. 1, the absolute value of the threshold voltage of this p MOS FET is set to a low value and the absolute value of the threshold voltage of this n MOS FET is set to a high value. The reference number 6 designates a power source of a predetermined voltage, 7 denotes a ground power source. The reference number 8 indicates a p channel MOS FET connected between the power source 6 and a power source line 12 as a hypothetical power source line. This p channel MOS FET 8 becomes active when a gate terminal of the P channel MOS FET 8 receives a control signal 9. The reference number 10 indicates an n channel MOS FET connected between ground 7 and a ground line 13 that is a hypothetical ground line. This n channel MOS FET 10 becomes active when a gate terminal of the n channel MOS FET 10 receives a control signal 11. In this circuit shown in FIG. 1, it is formed so that the absolute values of the threshold voltages of the p channel MOS FET 8 and the n channel MOS FET 10 are higher than the absolute values of the threshold voltages of the p channel MOS FETs 2 and 3 and the n channel MOS FETs 4 and 5 forming the two-input NAND gate 1, respectively.

FIG. 2 is a conventional layout pattern of a memory cell array in a conventional semiconductor integrated circuit device that was disclosed in the patent document of Japanese patent laid open publication number JP-A-8/18021. In FIG. 2, the reference number 210 indicates an array section in which a plurality of MOS FETs are arranged in an array form. The reference numbers 220, 230, 240, and 250 denote input/output circuit forming sections located in a peripheral section of the array section 210, in which input/output circuits are formed. The reference number 260 designates a region in which MOS FETs, each having a high threshold voltage, are formed in the array section 210. Further, the reference number 270 designates a region in which MOS FETs, each having a low threshold voltage, are formed in the array section 210.

Next, a description will be given of the operation of the conventional circuit capable of performing under a low supply voltage as the conventional semiconductor integrated circuit device shown in FIG. 2.

In recent years, there have been significant advancements of technology in portable devices such as mobile telephone devices and the portable devices are widely used in the world. Accordingly, it must be required to operate those portable devices under a lower power voltage in order to maintain the voltage of a battery as long as possible. To reduce the operational voltage used in the portable devices is an effective method to reduce the power consumption of the portable devices as small as possible. Because the power consumption is obtained by multiple of a voltage value and a current value, it is possible to reduce both the voltage value and the current value by reducing the operational voltage of the devices. In general, this method causes to obtain a greatly effect to reduce the power consumption of the devices. However, a MOS FET forming a semiconductor integrated circuit has a drawback in which the operation speed of the MOS FET becomes low according to reducing of the operational voltage. This characteristic of the MOS FET is based on that its threshold voltage is not reduced in proportion to the reducing of the voltage value of the power source. The reason is that the magnitude of a leak current under an off state (an inactive state) of the MOS FET is increased when the threshold voltage of the MOS FET is decreased, so that the power consumption is also increased.

In order to solve the conventional drawback described above, a following conventional method is used.

In the circuit operable under a low voltage shown in FIG. 1, when the two-input NAND gate 1 operates, the level of the control signal (CSB1) 9 is set to a low level and the control signal (CS1) 11, which is an inverted signal of the control signal (CSB1) 9 in voltage level, is set to a high level. Thereby, both the p channel MOS FET 8 and the n channel MOS FET 10 are ON and the voltage potential of the hypothetical power source line 12 rises up to the voltage level of the power source and the voltage potential of the ground line 13 is fallen to the voltage level of the ground GND 7. As a result, two-input NAND gate 1 operates as a normal NAND gate. In this case, because the threshold voltage of each of the MOS FETs 2 to 5 is set to the low value, it is possible to operate the two-input NAND gate 1 at a high speed when the voltage level of the power source 6 is low.

When the two-input NAND gate 1 is not used, the control signal (CSB1) 9 is set to the high level and the control signal (CS1) 11, that is the inverted signal of the control signal (CSB1) 9 in voltage level, is set to the low level. At this time, both the p channel MOS FET 8 and the n channel MOS FET 10 become OFF, so that the hypothetical power source lines 12 and the hypothetical ground line 13 are electrically disconnected from the power source 6 and the ground 7, respectively.

Because it is so formed that the absolute value of the threshold voltage of each of the p channel MOS FET 8 and the n channel MOS FET 10 is higher than that of each of the MOS FETs 2 to 5, it is possible to suppress the value of the leak current within a lower value.

In general, in a region in which the voltage between the gate and the source of a MOS FET is lower than a threshold voltage of the MOS FET, the magnitude of the leak current flowing through the source and the drain is exponentially increased according to the value of the voltage of the gate. It is therefore possible to greatly reduce the leak current when the MOS FETs 2 to 5 and the MOS FETs 8 and 10 have different threshold voltage values.

Although the above conventional example shows the two-input NAND gate 1 comprising MOS FETs, each having the lower absolute value of the threshold voltage, it is possible to apply the above method to many kinds of semiconductor integrated circuits in size and function such as other logical circuits, memory devices, and the like.

FIG. 2 is the conventional layout of the circuit comprising gate arrays capable of performing under a low voltage as the semiconductor integrated circuit shown in FIG. 1. In FIG. 1, both the p channel MOS FET 8 and the n channel MOS FET 10, each having a higher threshold voltage, are formed in regions 260, and the p channel MOS FETs 2 and 3 and the n channel MOS FETs 4 and 5, each having a lower threshold voltage, are formed in regions 270 that are the regions other than the region 260 in the array section 210. Further, the electric power from the power source 6, the ground voltage from the ground 7, and the control signals 9 and 11 are supplied to the array section 210 through input/output circuit regions 220, 230, 240, and 250.

Because the conventional circuit capable of performing under the low voltage as the semiconductor integrated circuit device has the configuration described above, namely, because both MOS FETs having the high threshold voltage and the low threshold voltage are formed in the array section 210, it is difficult to use the regions 260 (that is used for the MOS FETs having the high threshold voltage) in the array section for the internal circuits such as the two-input NAND gate 1 and wiring transferring signals and voltages of power source. Thereby, it becomes necessary to reduce the wiring efficiency in the array section 210 and the peripheral section thereof. This limitation causes to reduce the density of the layout of the semiconductor integrated circuit device.

In addition, in order to obtain a low power consumption, when the MT CMOS is used in a previously designed circuit (or in a pre-designed circuit) in which the MT CMOS is not used, it is difficult to use the pre-designed circuit without changing this layout pattern by the limitation of the regions 260 in the array section 210 in which the MOS FETs having the high threshold voltage are formed. This conventional layout of the circuit causes a drawback that it must be required to design a new layout pattern again.

SUMMARY OF THE INVENTION

Accordingly, an object of the present invention is, with due consideration to the drawbacks of the conventional semiconductor integrated circuit device, to provide a semiconductor integrated circuit device as a circuit capable of performing under a lower voltage by forming MOS FETs having a higher threshold voltage in regions other than the array section, capable of improving a layout efficiency and capable of using pre-designed circuits to be used in an array section without any changing of its circuit design and layout pattern.

In accordance with a preferred embodiment of the present invention, a semiconductor integrated circuit device comprises an array section in which a plurality of low threshold voltage metal oxide semiconductor field effect transistors (MOS FETs) are formed in array form, and input/output circuit forming areas other than the array section in which high threshold voltage MOS FETs having a high threshold voltage are formed. In the semiconductor integrated circuit device described above, the threshold voltage of each of the high threshold voltage MOS FETs is higher than a threshold voltage of each of the plurality of low threshold voltage MOS FETs formed in said array section.

In accordance with another preferred embodiment of the present invention, a semiconductor integrated circuit device comprises an array section in which a plurality of low threshold voltage metal oxide semiconductor field effect transistors (MOS FETS) are formed in array form, and input/output circuit forming areas located at peripheral sections of the array section, each area comprising a first area in which input/output circuits are formed and a second area in which MOS FETs whose absolute vale of a threshold voltage being higher than an absolute value of a threshold voltage value of each of the plurality of low threshold voltage MOS FETs formed in the array section.

In accordance with another preferred embodiment of the present invention, a semiconductor integrated circuit device comprises an array section in which a plurality of metal oxide semiconductor field effect transistors (MOS FETs) are formed in array form, and a plurality of areas, located at peripheral sections of the array section, in which high threshold voltage metal oxide field effect transistors (MOS FETs) and low threshold voltage MOS FETs are formed. In the semiconductor integrated circuit device described above, an absolute value of a threshold voltage of each of the high threshold voltage MOS FETs is higher than an absolute vale of a threshold voltage of each of the plurality of MOS FETs formed in the array section, and an absolute value of a threshold voltage of each of the low threshold voltage MOS FETs is lower than the absolute vale of the threshold voltage of each of the high threshold voltage MOS FETs, and each of the plurality of areas has an input/output circuit forming area having a same configuration.

In the semiconductor integrated circuit device as another preferred embodiment of the present invention, the plurality of high threshold voltage MOS FETs are formed at areas of four corners other than the array section and the input/output circuit forming sections in the semiconductor integrated circuit.

In the semiconductor integrated circuit device as another preferred embodiment of the present invention, the plurality of high threshold voltage MOS FETs are formed at space areas between the array section and the input/output circuit forming sections in the semiconductor integrated circuit.

In the semiconductor integrated circuit device as another preferred embodiment of the present invention, switch circuits for supplying power sources to the array section and electrically cutting the power sources from the array section are formed in the input/output circuit forming areas by using the high threshold voltage MOS FETs, and input/output circuits for inputting signals to the array section and outputting the signals from the array section are formed in the input/output circuit forming areas by using both the high threshold voltage MOS FETs and the low threshold voltage MOS FETS.

BRIEF DESCRIPTION OF THE DRAWINGS

These and other objects, features, aspects and advantages of the present invention will become more apparent from the following detailed description of the present invention when taken in conjunction with the accompanying drawings, in which.

DESCRIPTION OF THE PREFERRED EMBODIMENTS

Other features of this invention will become apparent through the following description of preferred embodiments which are given for illustration of the invention and are not intended to be limiting thereof.

Preferred embodiments of the semiconductor integrated circuit device according to the present invention will now be described with reference to the drawings.

First Embodiment

Figure 1:
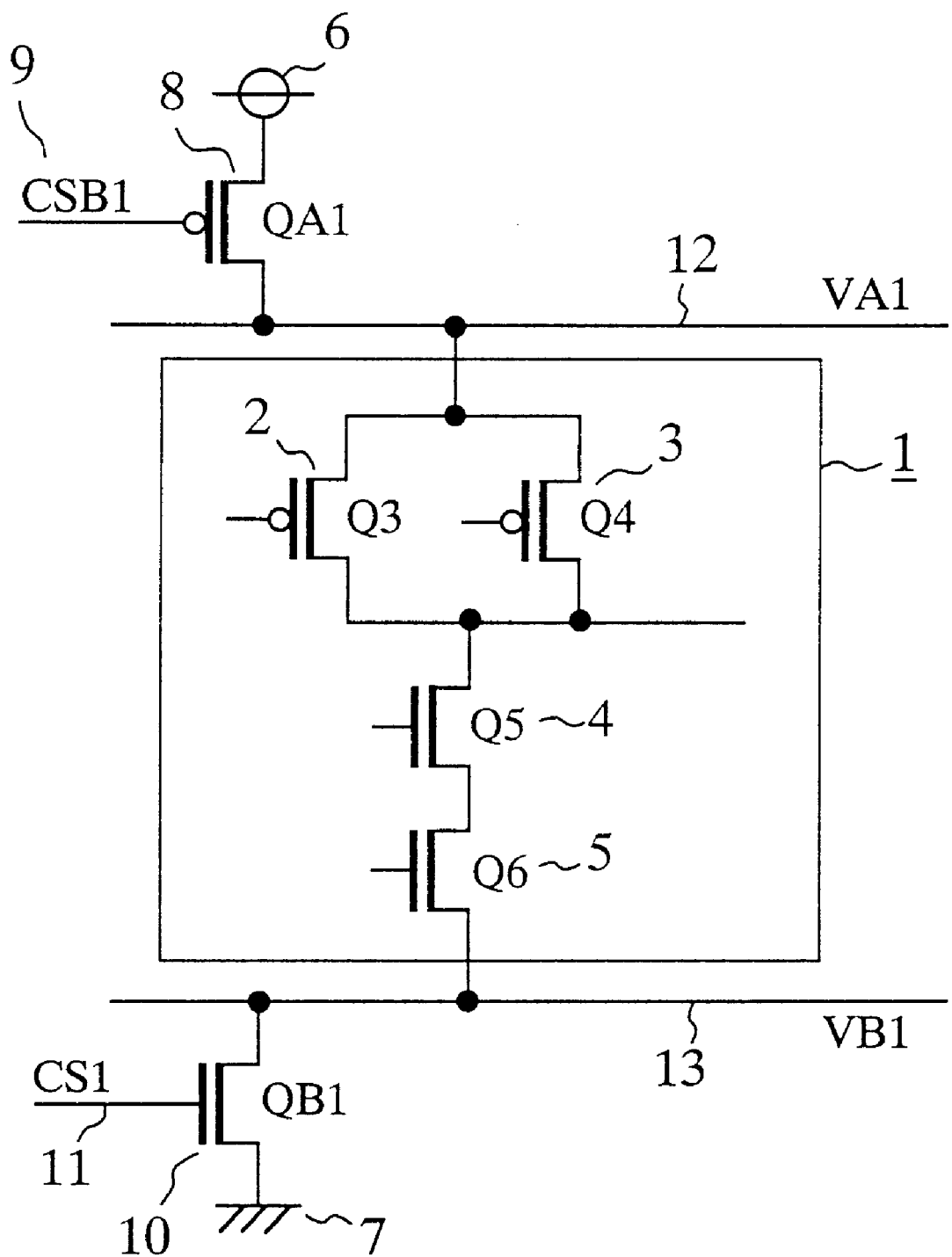
FIG. 1 is a circuit diagram showing a low voltage circuit capable of performing under a low voltage as a semiconductor integrated circuit device of the first embodiment according to the present invention.

FIG. 1 is the circuit diagram showing the circuit capable of performing under the low voltage as the semiconductor integrated circuit device of the first embodiment according to the present invention.

The circuit capable of performing under the low voltage (hereinafter referred to as the low voltage operation circuit) comprises multi-threshold complementary metal oxide semiconductors (hereinafter referred to as MT CMOS). In FIG. 1, the reference number 1 designates a two-input NAND gate, each of the reference numbers 2 and 3 denotes a p channel type metal oxide semiconductor field effect transistor (hereinafter referred to as a p MOS FET). Each of the reference numbers 4 and 5 indicates n channel type metal oxide semiconductor field effect transistors (hereinafter referred to as a n channel MOS FET). The absolute value of the threshold voltage of this p MOS FET is set to a low value and the absolute value of the threshold voltage of this n MOS FET is set to a high value. The reference number 6 designates the power source, 7 denotes the ground power source. The reference number 8 indicates the p channel MOS FET connected between the power source 6 and a power source line 12 as a hypothetical power source line. This p channel MOS FET 8 becomes active when a gate terminal of the P channel MOS FET 8 receives the control signal 9. The reference number 10 indicates the n channel MOS FET connected between the ground power source 7 and the ground voltage line 13 that is a hypothetical ground line. This n channel MOS FET 10 becomes active when a gate terminal of the n channel MOS FET 10 receives the control signal 11. In this circuit shown in FIG. 1, it is formed so that the values of the threshold voltages of the p channel MOS FET 8 and the n channel MOS FET 10 are higher than the values of the threshold voltages of the p channel MOS FETs 2 and 3 and the n channel MOS FETs 4 and 5 forming the two-input NAND gate 1, respectively.

Figure 3:
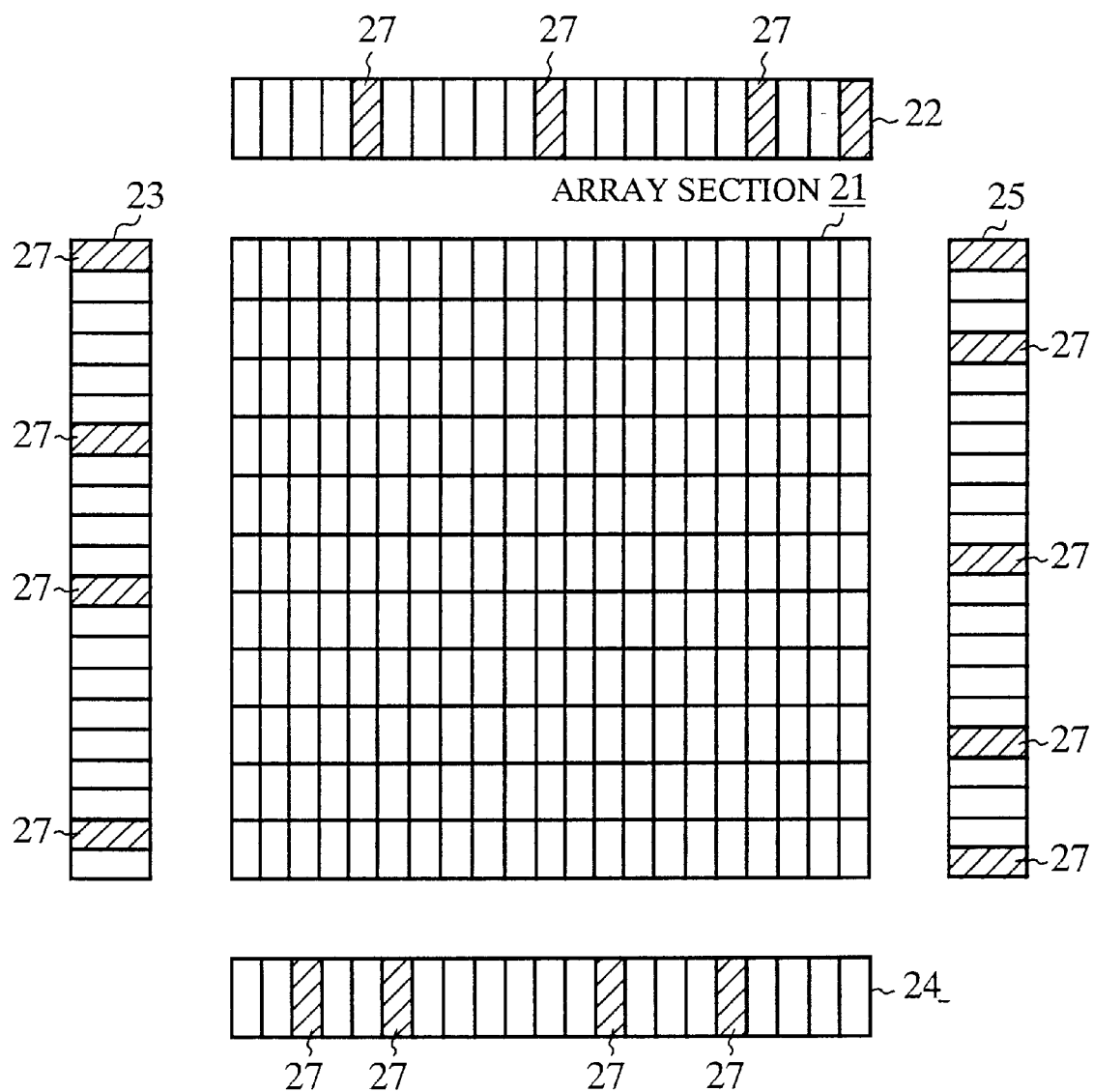
FIG. 3 is a diagram showing a layout pattern of regions in which the low voltage circuits capable of performing under the low voltage shown in FIG. 1 are formed as the semiconductor integrated circuit device of the first embodiment according to the present invention.

FIG. 3 is a diagram showing a layout pattern of the low voltage operation circuit shown in FIG. 1 as the semiconductor integrated circuit device of the first embodiment according to the present invention. In FIG. 3, the reference number 21 designates an array section in which a plurality of MOS FETs are arranged in array form, 22 to 25 denote input/output circuit section in which input/output circuits are formed in peripheral regions in the array section 21. The reference number 27 indicates regions in which MOS FETs (high threshold voltage MOS FET) are formed in and each MOS FET in the regions 27 has a higher threshold voltage than the threshold voltage of each MOS FET formed in the array section 21. In the regions other than the regions 27 in the input/output circuit sections 22 to 25, input/output circuits are formed.

Figure 4:
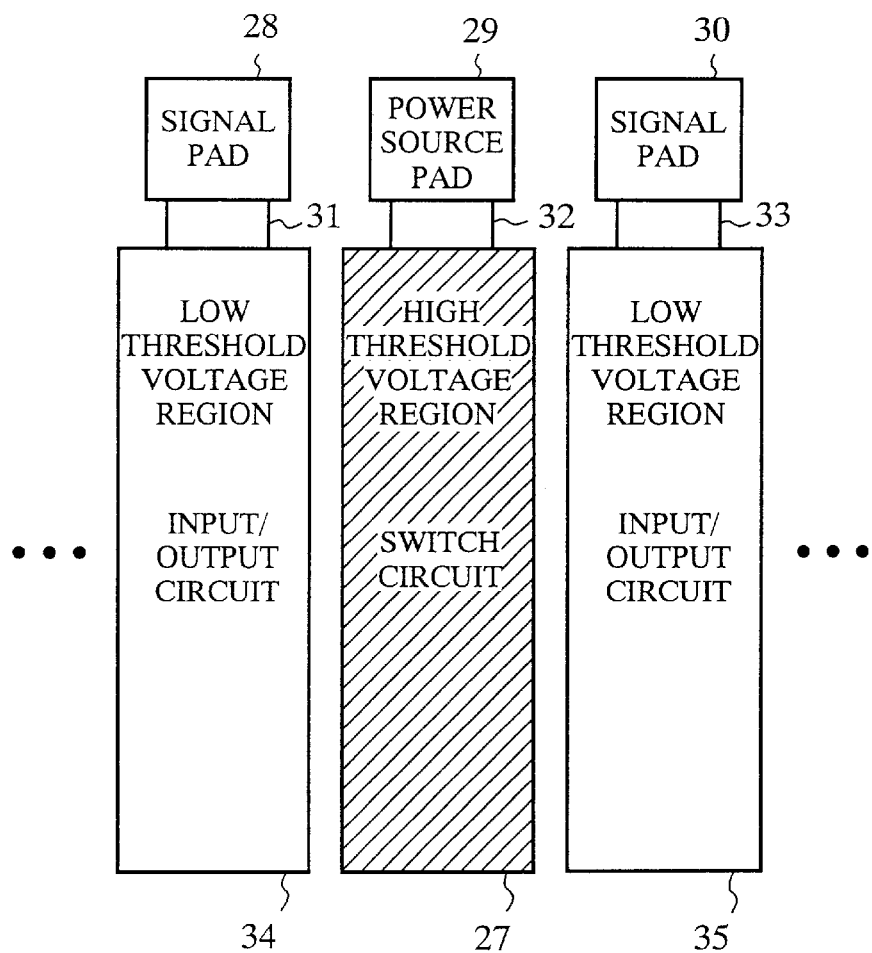
FIG. 4 is a diagram showing detailed layout patterns of the regions in which input/output circuits are formed in the semiconductor integrated circuit as the first embodiment shown in FIG. 3.

FIG. 4 is a diagram showing detailed layout patterns of the regions in which input/output circuits are formed in the semiconductor integrated circuit as the first embodiment shown in FIG. 3. In FIG. 4, the reference numbers 28 and 30 designate signal pads, 29 indicates a power source pad, and 31 to 33 denote lines as wiring connecting the signal pads 28 and 30 and the power source pad 29 to the input/output circuits formed in the regions 34 and 35 and switch circuits formed in the region 7. In this case shown in FIG. 4, the input/output circuits are formed in the regions 34 and 35 (namely, those regions 34 and 35 correspond to the regions other than the region 27 in the input/output forming regions 22 to 25 shown in FIG. 3) in which the low threshold voltage MOS FETs are formed, and the switch circuits are formed in the region 27 in which the high threshold voltage MOS FET are formed.

Figure 5:
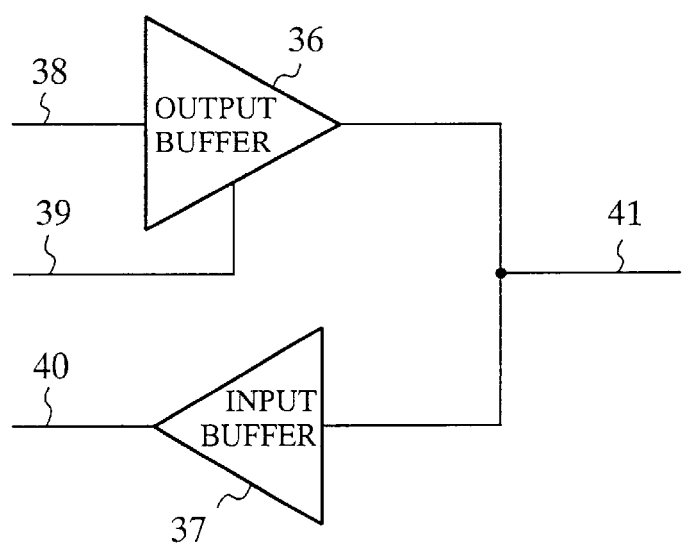
FIG. 5 is a detailed circuit diagram showing the input/output circuit formed in the input/output forming region in the semiconductor integrated circuit of the first embodiment shown in FIG. 3.

Further, FIG. 5 is a detailed circuit diagram showing the input/output circuit formed in the input/output forming region in the semiconductor integrated circuit of the first embodiment shown in FIG. 3. In FIG. 5, the reference number 36 designates an output buffer circuit, 37 denotes an input buffer circuit. The reference number 38 designates an output signal generated by internal circuits such as the two-input NAND gate 1 and the like, 39 indicates a control signal by which the output buffer circuit 36 enters the active state or the inactive state. The reference number 40 indicates an input signal to be transferred to the internal circuits, 41 designates an input/output signal transferred to the signal pads 28 and 30.

Next, a description will be given of the operation of the semiconductor integrated circuit device as the first embodiment.

In the low voltage operation circuit shown in FIG. 1, when the two-input NAND gate 1 operates, the level of the control signal 9 is set to the low level, and the level of the control signal that is the inverted level of the control signal 9 is set to the high level. Thereby, both the p channel MOS FET 8 and the n channel MOS FET 10 are ON and the level of the hypothetical power source line 12 is risen up to the voltage level of the power source 6 and the level of the hypothetical ground line 13 is fallen into the voltage level of the ground 7. As a result, the two-input NAND gate 1 performs the normal operation. In this case, because the value of the threshold voltage of each of the MOS FETs 2 to 5 is set to a low value, it is possible to operate the semiconductor integrated circuit of the first embodiment at a high speed even if the voltage level of the power source 6 is a low.

When the two-input NAND gate 1 is not used, the level of the control signal 9 is set to the high level and the level of the control signal 11 is set to the low level. In this case, both the p channel MOS FET 8 and the n channel MOS FET 10 become OFF. Thereby, both the hypothetical power source line 12 and the hypothetical ground line 13 are disconnected electrically from the power source 6 and the ground 7. Because both the absolute value of the threshold voltage of each of the p channel MOS FET 8 and the n channel MOS FET 10 is set to the high value rather than that of each of the MOS FETs 2 to 5, it is possible to suppress the magnitude of the leak current as small as possible.

In general, in the region in which MOS FETs (in each MOS FET, a voltage between the gate and the source of this MOS FET is a lower value than the threshold voltage of this MOS FET) are formed, because the leak current flowing through the source and the drain is increased exponentially corresponding to the increasing of the gate voltage, it is possible to reduce the leak current when the two-input NAND gate 1 is not used by setting the different threshold voltages to the MOS FETs 2 to 5 and the MOS FETs 8 and 10.

In the explanation of the semiconductor integrated circuit device of the first embodiment described above, although the two-input NAND gate 1 is used as the circuit comprising MOS FETs having the low threshold voltage, it is possible to apply this concept of the present invention to other kinds of circuits having different hardware sizes to form other logical devices, memory devices, and semiconductor integrated circuit devices.

FIG. 3 is the layout pattern of the low voltage operating circuit shown in FIG. 1 comprising gate arrays. In FIG. 3, the p channel MOS FET 8 and the n channel MOS FET 10 having the higher threshold voltage forming the switching circuits are formed in the region 27, and the p channel MOS FETs 2 and 3 and the n channel MOS FETs 4 and 5 having the lower threshold voltage forming the two-input NAND gate 1 are formed in the array section 21.

The voltages of the power source 6 and the ground 7, and the control signals 9 and 11 are provided to/from the array section 21 through the regions 22 to 25 in which the input/output circuits are formed.

FIG. 4 is the diagram showing the layout pattern of the switch circuits and the input/output circuits formed in the input/output circuit forming regions 22 to 25.

In general, the semiconductor integrated circuit device has the signal pads and the power source pads. Through the signal pads, various kinds of signals are transferred between the internal circuits and external circuits. The voltage and the ground voltage are provided to the internal circuits of the semiconductor integrated circuit device through the power source pads. In addition, the input/output circuit regions corresponding to the input/output pads are used for forming the input/output circuits. On the contrary, the input/output circuit regions corresponding to the power source pads are only used for connecting the power source lines and are not used for forming the input/output circuits comprising MOS FETS. Therefore it is possible to form the MOS FETs having a high threshold voltage in those input/output circuit regions corresponding to the power source pads.

In FIG. 4, the MOS FETs having the high threshold voltage are formed in the region corresponding to the power source pad 29. In this region, the p channel MOS FET 8 and the n channel MOS FET 10 having the high threshold voltage as the switch circuits are formed. The input/output circuit regions corresponding to the signal pads 28 and 30 are the regions 34 and 35 in which the MOS FETs having the low threshold voltage are formed. In those regions 34 and 35, the input/output circuits are formed.

FIG. 5 is the detailed circuit diagram showing the input/output circuit shown in FIG. 4. when the signals from the semiconductor integrated circuit are transferred to other circuits, when receiving the control signal 39, the output buffer circuit 36 is activated, and thereby, the output signal 38 is amplified by the MOS FET having a larger area formed in the output buffer 36 and transferred to the external devices, that are located in outside areas of the semiconductor integrated circuit device, as the input/output signal 41 having a larger driving ability.

Next, when an external signal generated by the outside devices of the semiconductor integrated circuit device is transferred to the internal circuits in the semiconductor integrated circuit device, the output buffer 36 receives the control signal 39, so that the output buffer 39 becomes inactive. Thereby, both two lines connected to the output buffer 36 are disconnected electrically. Therefore, the input/output signal 41 is amplified by the input buffer 40 without any influence from the output signal 38. Then, the input/output signal 41 amplified by the input buffer 37 is transferred to the internal circuit in the semiconductor integrated circuit device. In the semiconductor integrated circuit device as the first embodiment, both the output buffer circuit 36 and the input buffer circuit 37 are formed by using the MOS FETs having the low threshold voltage.

Figure 2:
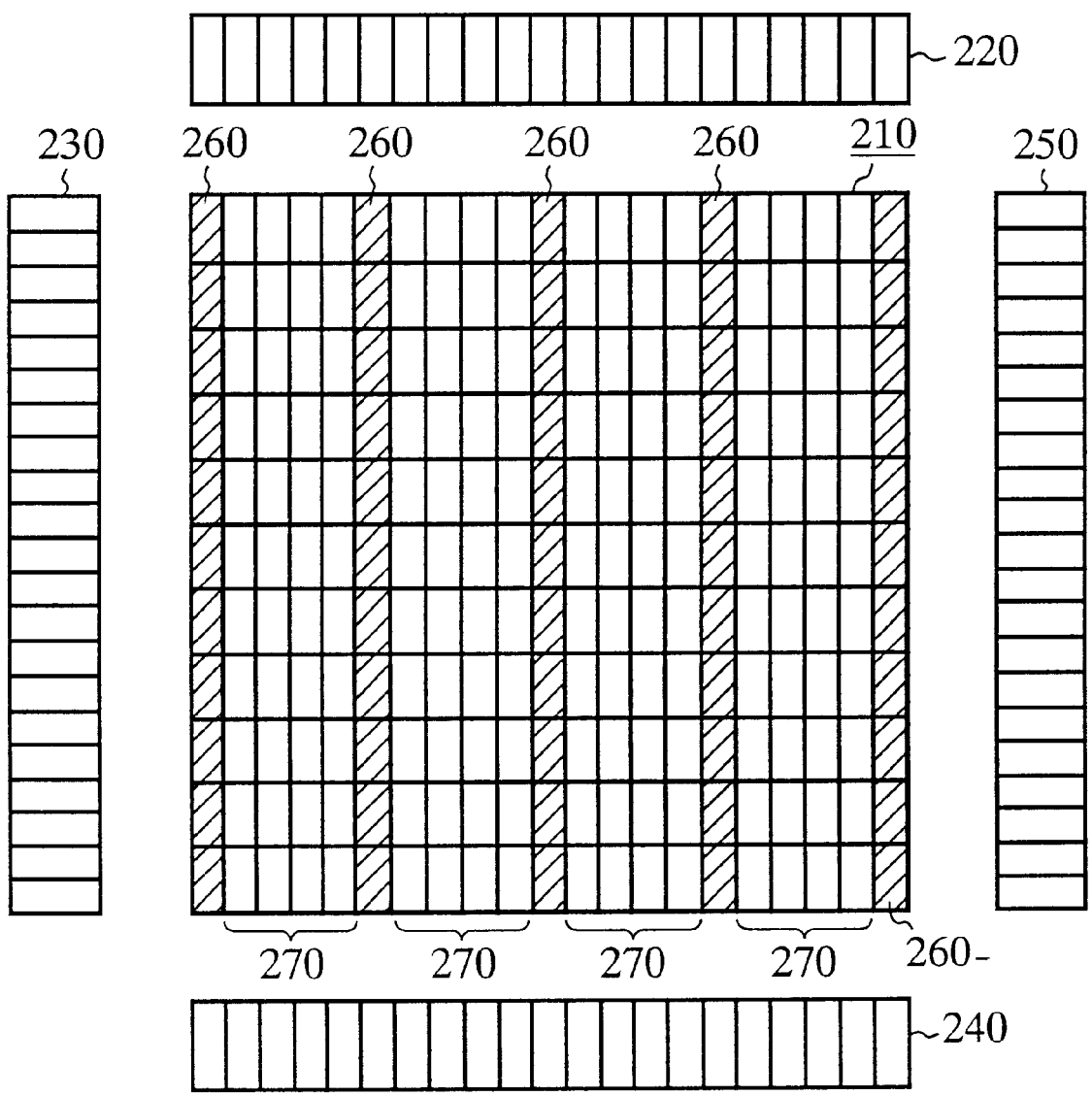
FIG. 2 is a diagram showing a layout pattern of a conventional semiconductor integrated circuit device corresponding to the low voltage circuit capable of performing under the low voltage shown in FIG. 1.

As described above, according to the semiconductor integrated circuit device as the first embodiment, it is possible to realize the semiconductor integrated circuit device including MT CMOSs capable of performing at a high speed and of achieving a low power consumption. In addition to this effect of the present invention, it may prevent to decrease the density of the layout pattern of the semiconductor integrated circuit device. On the contrary, the conventional semiconductor integrated circuit device shown in FIG. 2 has a lower density in the layout pattern because the region 260, in which the MOS FETs having the high threshold voltage are formed, limits the increasing of the density of the layout pattern.

Further, according to the first embodiment of the present invention, it is possible to use the pre-designed layout pattern in which no MT CMOS is used, it is possible to perform the wiring design efficiently. Furthermore, because the p channel MOS FET 8 and the n channel MOS FET 10 having the high threshold voltage are formed in the regions 27 in the input/output circuit forming regions 22 to 25, it is possible to use the pre-designed layout pattern of the input/output circuit forming regions 22 to 25 without any changing of the layout pattern. Thereby, it is possible to perform the layout design and the wiring design efficiently, and to reduce the design cost for the semiconductor integrated circuit device.

Second Embodiment

Figure 6:
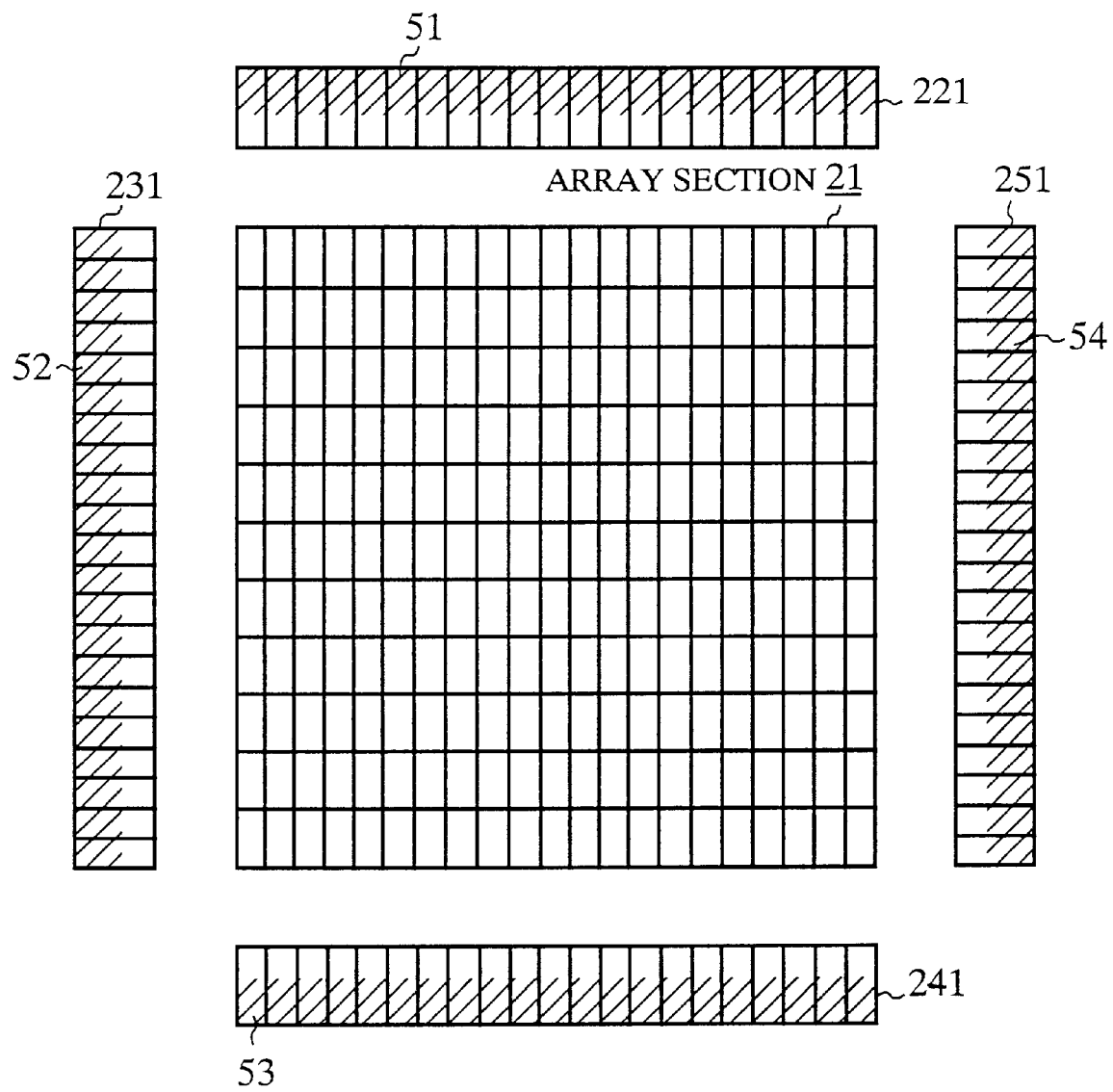
FIG. 6 is a diagram showing another layout pattern of the low voltage circuit capable of performing under the low voltage as the semiconductor integrated circuit device of the second embodiment according to the present invention.

FIG. 6 is a diagram showing another layout pattern of the low voltage circuit capable of performing under the low voltage as the semiconductor integrated circuit device of the second embodiment according to the present invention. In FIG. 6, each of the input/output circuit forming regions 221, 231, 241, and 251 is made up of a plurality of regions. In each of the regions 221, 231, 241, and 251, both MOS FETs having a low threshold voltage (hereinafter, also referred to as low threshold voltage MOS FET) and MOS FETs having a high threshold voltage (hereinafter, also referred to as high threshold voltage MOS FET) are formed. Each of the regions 221, 231, 241, and 251 is the same configuration in the semiconductor integrated circuit as the first embodiment. The reference numbers 51 to 54 designate regions in the regions 221, 231, 241, and 251 in which the high threshold voltage MOS FETs are formed. In FIG. 6, the regions 51 to 54 are designated by shadowed lines or slanted lines.

Figure 7:
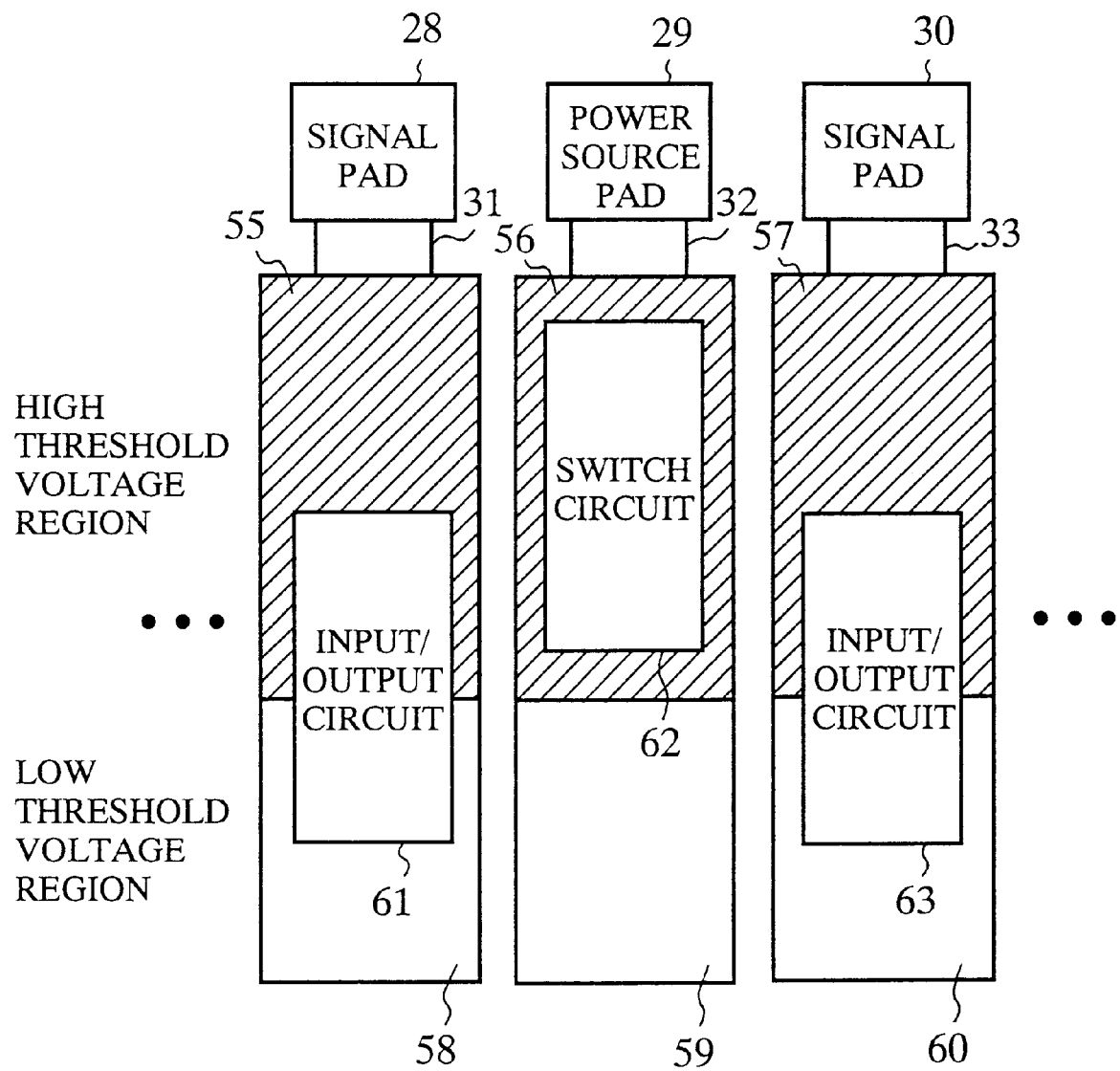
FIG. 7 is a diagram showing another layout pattern of the regions in which the input/output circuits are formed in the semiconductor integrated circuit as the second embodiment shown in FIG. 6.

FIG. 7 is a diagram showing a layout pattern of the regions 221, 231, 241, and 251 in which the input/output circuits comprising MOS FETs are formed in the semiconductor integrated circuit as the second embodiment shown in FIG. 6. In FIG. 7, the reference numbers 55 to 57 designate the regions in which the high threshold voltage MOS FETs are formed, and the reference numbers 58 to 60 designate the regions in which the low threshold voltage MOS FETs are formed. In FIG. 7, the regions 55, 56, and 57 are designated by shadowed lines or slanted lines. The reference numbers 61 and 63 designate input/output circuits located between the regions 55 for forming the high threshold voltage MOS FETs and the region 58 for forming the low threshold voltage MOS FETS, and between the regions 57 for forming the high threshold voltage MOS FETs and the region 60 for forming the low threshold voltage MOS FETs. Each of the regions in which the input/output circuits 61 and 63 are formed has the same configuration. The reference number 62 indicates a switch circuit located in the region 56 in which the high threshold voltage MOS FETS are formed.

Next, a description will be given of the operation of the low voltage circuit capable of performing under a low voltage as the semiconductor integrated circuit device as the second embodiment.

In the input/output circuit forming regions 221, 231, 241, and 251 in the semiconductor integrated circuit device as the second embodiment, shown in FIG. 6, both the high threshold voltage MOS FETs and the low threshold voltage MOS FETs may be used. In general, the input/output circuit comprises MOS FETs having a larger size in area in order to drive external devices as heavy load devices. When this input/output circuit comprises MOS FET having a low threshold voltage, a large leak current flows. This causes to increase the power consumption of semiconductor integrated circuit device.

As shown in FIG. 7, according to the semiconductor integrated circuit device as the second embodiment, it is possible to halt flowing of the leak current because the input/output circuits 61 and 63 may be formed in both the high threshold MOS FET forming region 55 and the low threshold MOS FET forming region 58, and the high threshold MOS FET forming region 57 and the low threshold MOS FET forming region 60, respectively.

For example, it is possible to cut the flow of the leak current because the output buffer circuit 36 in the input/output circuit shown in FIG. 5 may comprises the high threshold voltage MOS FETs formed in the high threshold voltage MOS FET forming region 55.

In addition, the switch circuit 62 shown in FIG. 7 comprises the p channel MOS FET 8 and the n channel MOS FET 10 shown in FIG. 1 that are made up of only the high threshold voltage MOS FETs formed in the region 62.

As described above, according to the semiconductor integrated circuit device as the second embodiment, it is possible to obtain the same effect of the first embodiment of the present invention. In addition to this effect, because it is possible to form all of the gates of the input/output circuits, it is possible to form the switch circuits for the power source pads and the input/output circuits for the signal pads at optional positions. This causes to form circuits having optional functions by using gate arrays. Furthermore, because it is possible to form the input/output circuits by using both the high threshold voltage MOS FETs and the low threshold voltage MOS FETs, it is possible to form the input/output circuits in which a small value of a leak current flows. Therefore this causes to decrease the power consumption of the semiconductor integrated circuit device.

Third Embodiment

Figure 8:
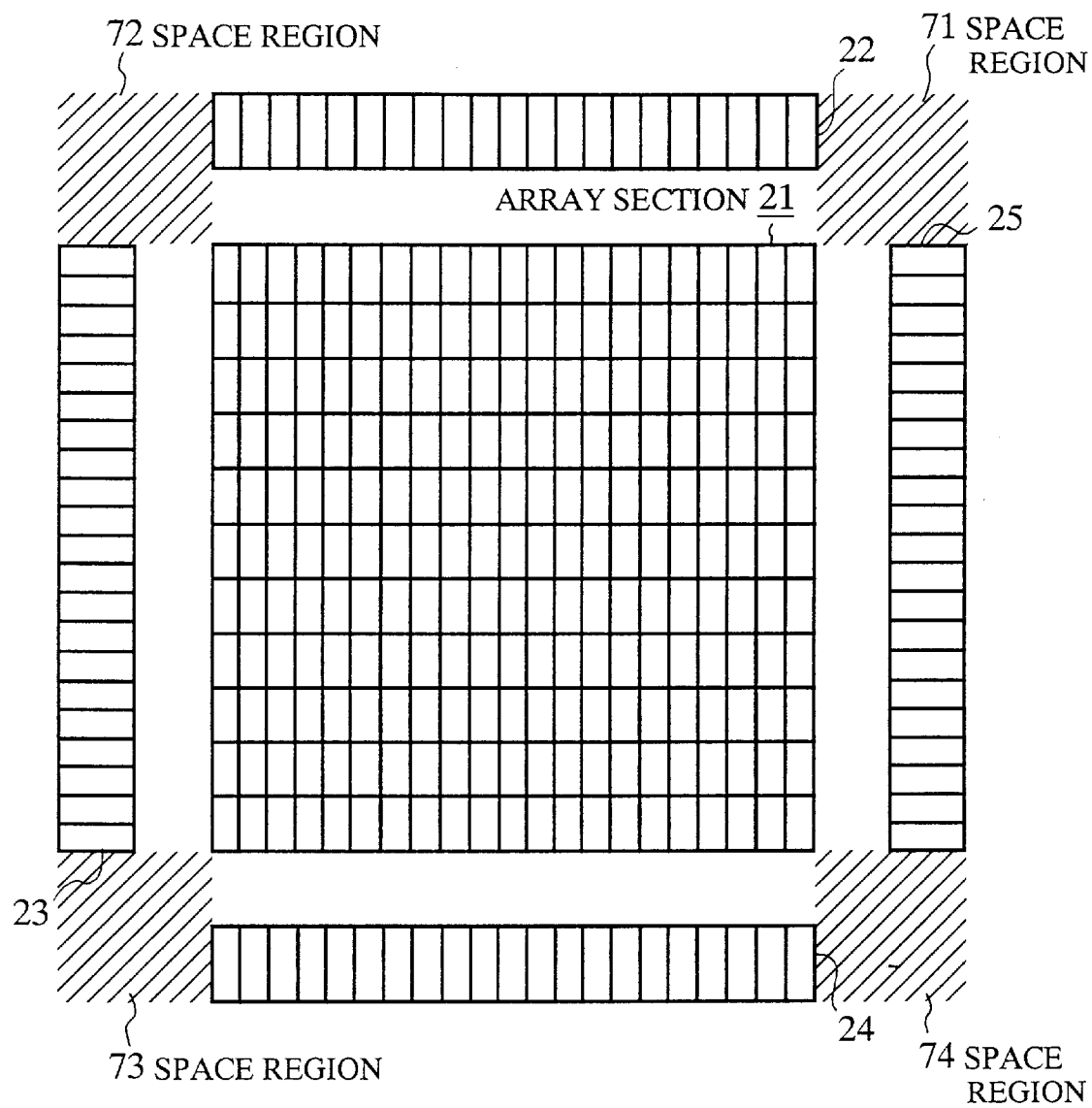
FIG. 8 is a diagram showing another layout pattern of the low voltage circuit capable of performing under the low voltage as the semiconductor integrated circuit device of the third embodiment according to the present invention.

FIG. 8 is a diagram showing another layout pattern of the low voltage circuit capable of performing under the low voltage as the semiconductor integrated circuit device as the third embodiment according to the present invention. In FIG. 8, the reference numbers 71, 72, 73, and 74 designate space areas located at four corners of the array section 21 other than the input/output circuit forming regions 22, 23, 24, and 25 in a semiconductor chip. In this third embodiment, the high threshold voltage MOS FETs are formed at the space areas 71 to 74 in the four corners. In FIG. 8, the space areas are designated by shadowed lines or slanted lines.

Next, a description will be given of the operation of the semiconductor integrated circuit device as the third embodiment.

In general, MOS FETs are not formed at the space areas 71 to 74 located at the four corners in a conventional semiconductor chip. In the third embodiment, the p channel MOS FET 8 and the n channel MOS FET 10 are formed in the space areas 71 to 74 in the four corners by using MOS FETs of the high threshold voltage.

As described above, according to the semiconductor integrated circuit device as the third embodiment, it is possible to obtain the same effect of the semiconductor integrated circuit device as the first embodiment. In addition to this effect, because it is possible to form the gates having the same configuration in the input/output circuit forming regions 22 to 25 in the semiconductor integrated circuit as the third embodiment, it is possible to form the input/output circuits for the signal pads at desired areas and possible to form desired circuits by using gate arrays.

Fourth Embodiment

Figure 9:
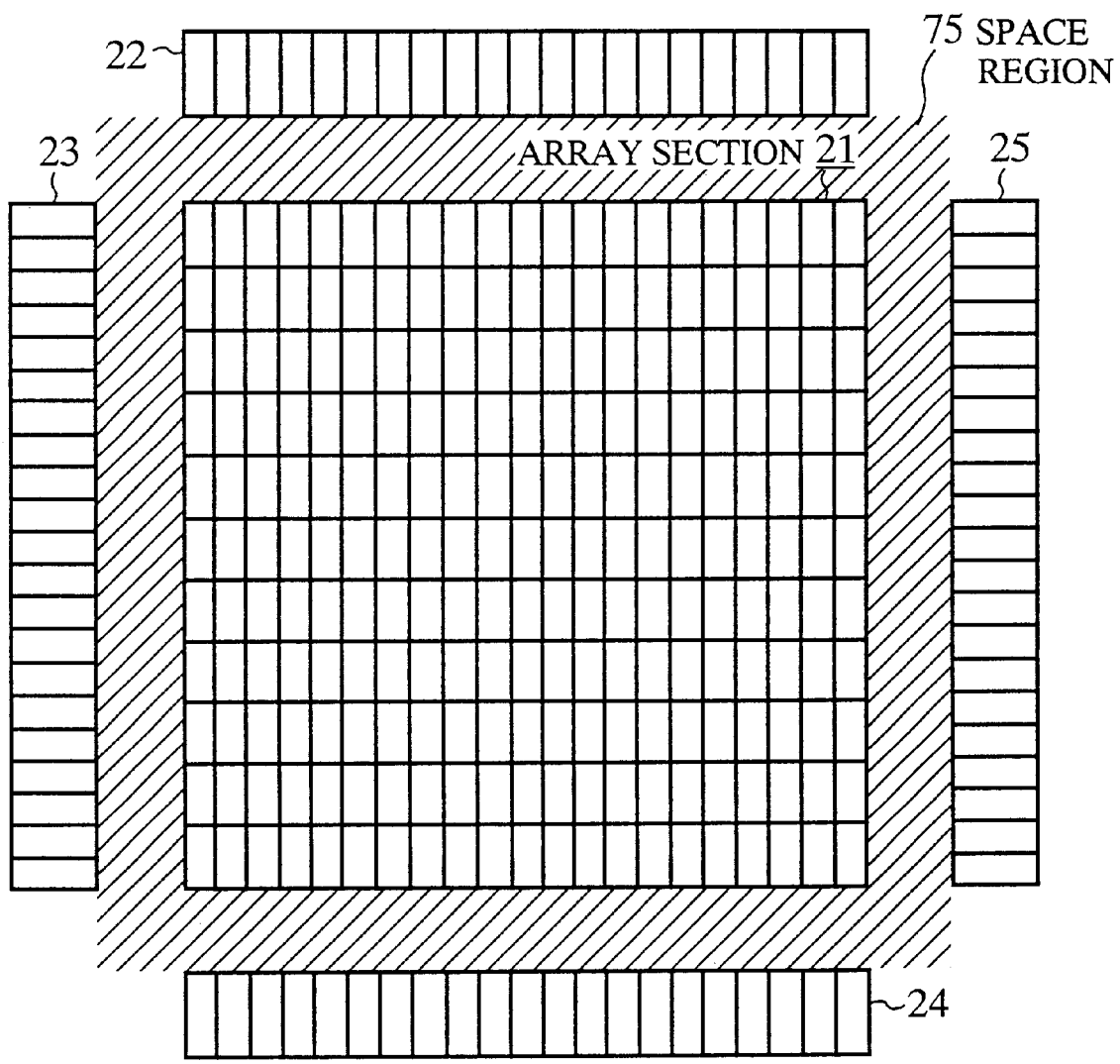
FIG. 9 is a diagram showing another layout pattern of the low voltage circuit capable of performing under the low voltage as the semiconductor integrated circuit device of the fourth embodiment according to the present invention.

FIG. 9 is a diagram showing another layout pattern of the low voltage circuit capable of performing under the low voltage as the semiconductor integrated circuit device of the fourth embodiment according to the present invention. In FIG. 9, the reference number 75 designates a space area located between the array section 21 and the input/output circuit forming areas 22 to 25. In FIG. 9, the space area 75 is designated by shadowed lines or slanted lines. In the space area 75, the MOS FETs having the high threshold voltage are formed.

Next, a description will be given of the operation of the semiconductor integrated circuit device as the fourth embodiment.

In general, MOS FETs are not formed at the space area 75 located between the array section 21 and the input/output circuit forming sections 22 to 25 in the conventional semiconductor chip. In the fourth embodiment of the present invention, the p channel MOS FET 8 and the n channel MOS FET 10 are formed in the space area 75 by using MOS FETs of the high threshold voltage.

As described above, according to the semiconductor integrated circuit device as the fourth embodiment, it is possible to obtain the same effect of the semiconductor integrated circuit device as the third embodiment. That is, it is possible to obtain the same effect of the semiconductor integrated circuit device as the third embodiment. In addition to this effect, because it is possible to form the gates having the same configuration in the input/output circuit forming regions 22 to 25 in the semiconductor integrated circuit as the fourth embodiment, it is possible to form the input/output circuits for the signal pads at desired areas and possible to form desired circuits by using gate arrays.

As set fourth above, according to the semiconductor integrated circuit device of the present invention, because only the low threshold voltage MOS FETs are formed in the array section, it is possible to have a higher density of the layout pattern of the semiconductor integrated circuit device rather than that of the conventional semiconductor integrated circuit device in which the limitation caused by the high threshold voltage MOS FET arranged in the array section decreases the density of the layout pattern. In addition to this, it is possible to use the pre-designed layout pattern in which no MT CMOSs are used without any changing of its design. It is thereby possible to perform the layout design and to perform the wiring efficiently.

In addition, according to the semiconductor integrated circuit device of the present invention, because the high threshold voltage MOS FETs are formed in areas, that are not used normally, other than the input/output circuit forming areas, it is possible to use apply the layout pattern, that has been designed for the input/output circuit forming regions, without any changing of its layout pattern. It is thereby possible to perform the layout design and to perform the wiring efficiently.

Furthermore, according to the semiconductor integrated circuit device of the present invention, because the all of the input/output circuit forming regions have the same configuration, it is possible to form the switch circuits and the input/output circuits at desired positions. Furthermore, because both the high and low threshold voltage MOS FETs are used before forming the input/output circuits, it is possible to form the input/output circuits in which a smaller leak current flows. Moreover, it is thereby possible to reduce the power consumption of the semiconductor integrated circuit.

Moreover, according to the semiconductor integrated circuit device of the present invention, because all of the input/output circuit forming regions have the same configuration, it is possible to form the input/output circuits used for the signal pads at desired position in the semiconductor chip, and possible to form an optional circuit by using gate arrays.

Furthermore, according to the semiconductor integrated circuit device of the present invention, because the input/output circuits are formed by using both the high threshold voltage MOS FETs and the low threshold voltage MOS FETs, a small leak current flows in those input/output circuits, it is possible to reduce the power consumption of the semiconductor integrated circuit.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A semiconductor integrated circuit device comprising:

an internal circuit section in which an integrated circuit is formed, the integrated circuit including at least MOS transistors of same conductivity type, a plurality of terminal pads arranged in a direction, including at least a power source pad which receives a power voltage and signal pads, and a plurality of buffer regions arranged laid out in a line, wherein a switch MOS transistor is formed in at least one of said plurality of buffer regions and is electrically connected between the power source pad and the internal circuit when said switch MOS transistor is conductive, and buffer circuits are formed in others of said plurality of buffer regions and connected to the signal pads, respectively, each buffer circuit including at least one of an input buffer circuit and an output buffer circuit, the input buffer circuit connected between the internal circuit and one of the signal pads and transfers a signal from the one signal pad to the internal circuit, and the output buffer circuit connected between the internal circuit and the one signal pad and transfers a signal from the internal circuit to the one signal pad, wherein the switch MOS transistor has a threshold voltage whose absolute value is higher than that of each of the MOS transistors in said internal circuit section.

2. The semiconductor integrated circuit device of claim 1, wherein first and second MOS transistors are formed in each of said plurality of buffer regions, the second MOS transistor having a threshold voltage whose absolute value is higher than that of the first MOS transistor, and the second MOS transistor of the buffer region, connected to the power source pad, serves as said switch MOS transistor.

3. The semiconductor integrated circuit device of claim 2, wherein the buffer circuits in buffer regions connected to the signal pads, each includes the first MOS transistor and the second MOS transistor.

4. The semiconductor integrated circuit device of claim 2, wherein the first MOS transistors in said plurality of buffer regions and the second MOS transistors in said plurality of buffer regions are arranged in a same direction.

5. The semiconductor integrated circuit device of claim 1, wherein the MOS transistors in said internal circuit section are arranged in an array form.

* * * * *